United States Patent
Agarwal et al.

(10) Patent No.: US 7,447,606 B2
(45) Date of Patent: Nov. 4, 2008

(54) METHOD OF SEPARATING THE PROCESS VARIATION IN THRESHOLD VOLTAGE AND EFFECTIVE CHANNEL LENGTH BY ELECTRICAL MEASUREMENTS

(75) Inventors: Kanak B. Agarwal, Austin, TX (US); Sani R. Nassif, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 128 days.

(21) Appl. No.: 11/551,814

(22) Filed: Oct. 23, 2006

(65) Prior Publication Data

US 2008/0097715 A1 Apr. 24, 2008

(51) Int. Cl.
*G01R 31/00* (2006.01)
*G01R 31/14* (2006.01)

(52) U.S. Cl. .................. 702/117; 702/64; 702/118; 702/119; 324/765

(58) Field of Classification Search ......... 702/117–123, 702/57, 64–69, 86; 703/2, 14; 438/11, 14, 438/15, 18; 257/48; 324/765, 769
See application file for complete search history.

(56) References Cited

U.S. PATENT DOCUMENTS

| 5,438,527 A * | 8/1995 | Feldbaumer et al. ........... 716/19 |
| 2002/0063572 A1* | 5/2002 | Yamaguchi et al. ......... 324/769 |
| 2005/0193013 A1* | 9/2005 | Yamashita et al. ....... 707/104.1 |

* cited by examiner

*Primary Examiner*—Eliseo Ramos-Feliciano
*Assistant Examiner*—Phuong Huynh
(74) *Attorney, Agent, or Firm*—Casimer K. Salys; Winstead, P.C.

(57) ABSTRACT

A IC wafer is fabricated using a process of interest to have a plurality of FET devices with different channel lengths (Leff) form a plurality of channel length groups. The threshold voltage (VT) is measured of a statistical sample of the FET devices in each channel length group at two different drain-to-source voltage (VDS). The mean of VT is calculated for each channel length and each VDS. A slope coefficient λ relating VT to Leff is calculated at each VDS. The total variance of VT is calculated at each VDS. Two equations at each VDS, each relating the total variance of VT to the variance of VT with respect to dopant levels and the square of the slope coefficient λ times the variance of Leff, are solved simultaneously to obtain the variance of VT with respect to dopant levels and the variance of Leff.

6 Claims, 3 Drawing Sheets

METHOD OF SEPARATING THE PROCESS VARIATION IN THRESHOLD VOLTAGE AND EFFECTIVE CHANNEL LENGTH BY ELECTRICAL MEASUREMENTS

TECHNICAL FIELD

The present invention relates to MOS devices and in particular to methods for separating the variance of threshold voltage with respect to dopant levels and the variance of the effective channel length.

BACKGROUND INFORMATION

Metal-Oxide-Silicon (MOS) devices and complementary MOS (CMOS) circuit structures have become dominant in the fabrication of circuitry for digital processing. Integrated circuits (IC) have become increasingly powerful in circuit density and circuit speed has increased. To accomplish this improvement, technologists have been able to continue this trend by device scaling and by improving materials and IC fabrication processes.

As devices have become smaller, process variations have a much greater affect on circuit performance variability and thus it is more difficult to predict the performance of an IC and thus the system in which it is intended to function.

MOS devices are basically voltage controlled current switches. The gate voltage determines how much current flows in the channel somewhat independent of the voltage across the channel from source to drain. Using the CMOS structure where there is no static power dissipation (excluding leakage) the current from an ON device is used to charge or discharge the capacitance of the gate(s) of following circuits. The drain current in a MOS device is inversely proportional to the effective channel length (Leff) and directly proportional to the difference between the gate-to-source voltage (VGS) and the devices threshold voltage (VT). VGS is usually an applied voltage and VT is an intrinsic parameter which is a function of the fabrication process and its variations. To complicate matters Leff and VT are interdependent.

To accurately design a MOS fabrication process, it is necessary to isolate each parameter VT and Leff and understand what process steps are causing their variability (variance). Both of these parameters affect drain current and are difficult to directly determine as device sizes have gotten smaller, therefore, the variance of these parameters are not independently determined.

Prior art has used devices with larger channel lengths in an attempt to assure there is no Leff variability as a way of removing the interdependence of Leff and VT. However, since variance of VT due to dopant fluctuation also depends on gate area, there can be no comparison of devices with different gate areas. Others have tried to building test sites with different channel lengths but with the same gate areas. Critical dimension (CD) metrology has also be attempted but it is an expensive process.

Therefore, there is a need for a method that uses automatic testing measurements to accurately and efficiently separate the variance of threshold voltage VT with respect to dopant levels and the variance of the effective channel length Leff to allow these parameters to be controlled as scaling reduces chip device geometries.

SUMMARY OF THE INVENTION

Devices are made with a plurality of effective channel lengths Leff. Measurements are made on a statistically large number of devices at drain-to-source voltages VDS(high) and VDS(low). Since the threshold voltage VT is a function of Leff and VDS, this allows a VT versus Leff slope value λ for VDS(high) and VDS(low) to be determined experimentally; λ(H) and λ(L), respectively. Likewise, the total variance of VT may be calculated using measurements made at VDS (high) and VDS(low). Since VT is a linear function of λ times Leff over limited ranges, the variance of VT with respect to Leff may be written as the square of λ times the variance of Leff. Therefore, two equations may be written; one relating the total variance of VT at VDS(high) to the variance of VT with respect to dopant levels plus the square of λ (H) times the variance of Leff and the other relating the total variance of VT at VDS(low) to the variance of VT with respect to dopant levels plus the square of λ (L) times the variance of Leff. The total variance of VT is calculated using the measurements of VT made at VDS(high) and VDS(low). The mean or average of VT at two channels lengths and at VDS(high) and VDS (low) are calculated. These mean values of VT are used to calculate the slope values λ (H) and λ (L) at VDS(high) and VDS(low). The two equations are solved simultaneously to separately determine the variance of VT with respect to dopant levels and the variance of Leff.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings in which.

DETAILED DESCRIPTION

Figure 1:
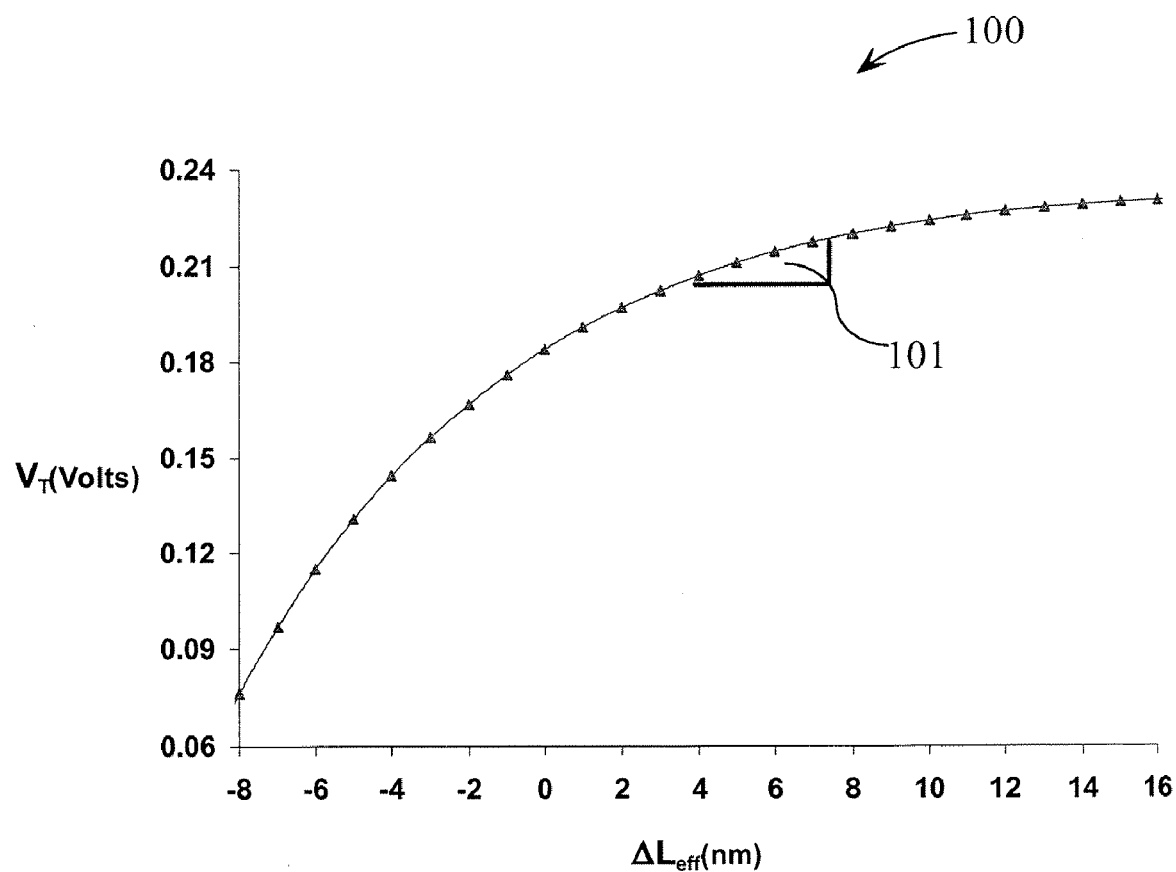
FIG. 1 is a curve illustrating the relationship between the threshold voltage VT and the effective channel length Leff.

In the following description, numerous specific details are set forth to provide a thorough understanding of the present invention. For example, specific logic functions and the circuitry for generating them may be described; however, it would be recognized by those of ordinary skill in the art that the present invention may be practiced without such specific details. In other instances, well-known circuits have been shown in block diagram form in order not to obscure the present invention in unnecessary detail. Refer now to the drawings wherein depicted elements are not necessarily shown to scale and wherein like or similar elements are designated by the same reference numeral by the several views.

FIG. 1 is a curve 100 illustrating the relationship between changes in the effective channel length ΔLeff and the threshold voltage VT. Over limited ranges of ΔLeff the slope 101 of the curve is constant and is referred to in the following as λ.

Figure 2:
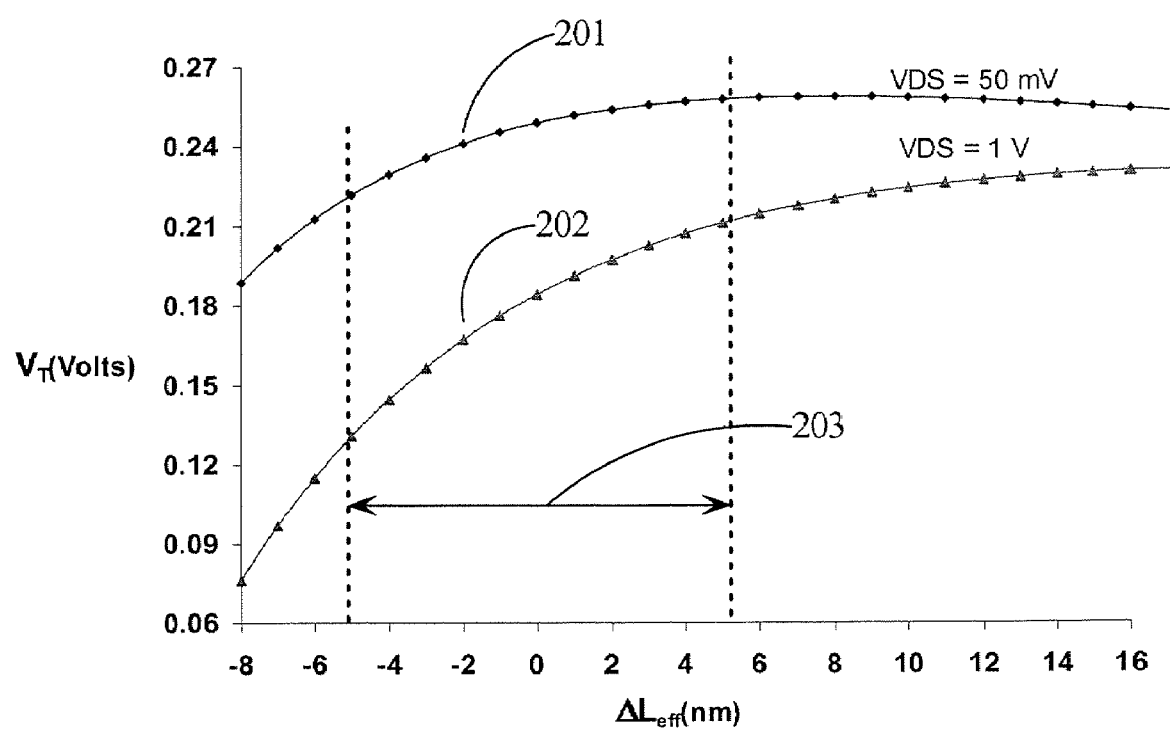
FIG. 2 is curves illustrating the dependency of the curves relating VT and Leff with the drain-to-source voltage VDS.

FIG. 2 shows two curves 201 and 202 illustrating the dependence of relationship between ΔLeff and the threshold voltage VT and the drain-to-source voltage VDS over a range of ΔLeff (e.g., 203).

The goal of the method of the present invention is to determine the variance of VT and the variance of Leff using simple electrical measurement techniques and computations. The total variability (variance) of VT comes from two sources; variance due to intrinsic dopant fluctuation ($\sigma^2_{VT,Dopant}$) and the variance of VT due to the channel length ($\sigma^2_{VT,Leff}$).

VT is directly related to Leff and, over limited ranges of Leff, may be shown to be nearly linearly related by a slope $\lambda$. See equation (1).

$$\Delta VT = \lambda (\Delta Leff) \quad (1)$$

Therefore, using statistical equations, the total variance of VT due to dopant and Leff may be shown to be represented as follows:

$$\sigma_{V_T}^2 = \sigma_{V_T,Dopant}^2 + \lambda^2 \times \sigma_{L_{eff}}^2 \quad (2)$$

Equation (2) states that the total variance of VT is equal to the variance of VT with respect to dopant levels plus the square of the slope $\lambda$ times the variance of Leff.

As stated above, over a limited range, VT is nearly linearly related to Leff by the slope $\lambda$ which is referred to as drain induced barrier lowering (DIBL). The slope term $\lambda$ is also dependent on the drain-to-source voltage VDS and increases with increasing VDS.

$$\lambda_{(V_{DS}-High)} > \lambda_{(V_{DS}-Low)} \quad (3)$$

The above relationships allow two equations (4) to be written that isolates the two variables of interest. One equation equates the total variance of VT at VDS(Low) to the variance of VT with respect to dopant levels, $\lambda$ at VDS(Low), and the variance of the effective channel length Leff. The second equation equates the total variance of VT at VDS(High) to the variance of VT with respect to dopant levels, $\lambda$ at VDS(High), and the variance of the effective channel length Leff.

$$\sigma_{V_{T(V_{DS}-Low)}}^2 = \sigma_{V_T,Dopant}^2 + \lambda^2_{(V_{DS}-Low)} \times \sigma_{L_{eff}}^2$$
$$\sigma_{V_{T(V_{DS}-High)}}^2 = \sigma_{V_T,Dopant}^2 + \lambda^2_{(V_{DS}-High)} \times \sigma_{L_{eff}}^2 \quad (4)$$

A test IC is prepared with FET devices fabricated in the process being analyzed at a plurality of channel lengths, for example, 55 nm=L1, 60 nm=L2, and 65 nm=L3. The VT of a statistically large number of the FET devices in each channel length group are then measured at VDS(Low) and VDS (High). The average or mean value of VT ($\mu_{VT(Lx)}$) is calculated for each channel length group and for each voltage level. This allows $\lambda$ at VDS(Low) and VDS(High) to be determined using the following:

$$\lambda_{(V_{DS})} = \frac{\partial V_T}{\partial L_{eff}}\bigg|_{(V_{DS})} = \frac{\mu_{V_T(L_2)} - \mu_{V_T(L_1)}}{L_2 - L_1}\bigg|_{(V_{DS})} \quad (5)$$

Equation (5) states that $\lambda$ at a particular VDS is equal to the difference in the mean value of VT at L2 and L1 divided by the difference in the channel lengths L2 and L1. Likewise, the total variance of VT ($\sigma^2_{VT, VDS(Low)}$ and $\sigma^2_{VT, VDS(High)}$) at the two voltage values of VDS may be calculated using the statistical calculations and the values of VT and its mean value $\mu_{VT(Lx)}$. Calculating these values allows the two equations (4) to be solved for the desired variables using the following:

$$\sigma_{L_{eff}}^2 = \frac{\sigma_{V_T(V_{DS}-High)}^2 - \sigma_{V_T(V_{DS}-Low)}^2}{\lambda^2_{(V_{DS}-High)} - \lambda^2_{(V_{DS}-Low)}} \quad (6)$$

$$\sigma_{V_T,Dopant}^2 = \sigma_{V_T(V_{DS}-High)}^2 - \lambda^2_{(V_{DS}-High)} \times \sigma_{L_{eff}}^2 \quad (7)$$

Alternately, the variance of VT with respect to dopant levels may be also calculated using the slope $\lambda$ and total variance of VT values for VDS (low).

Figure 3:
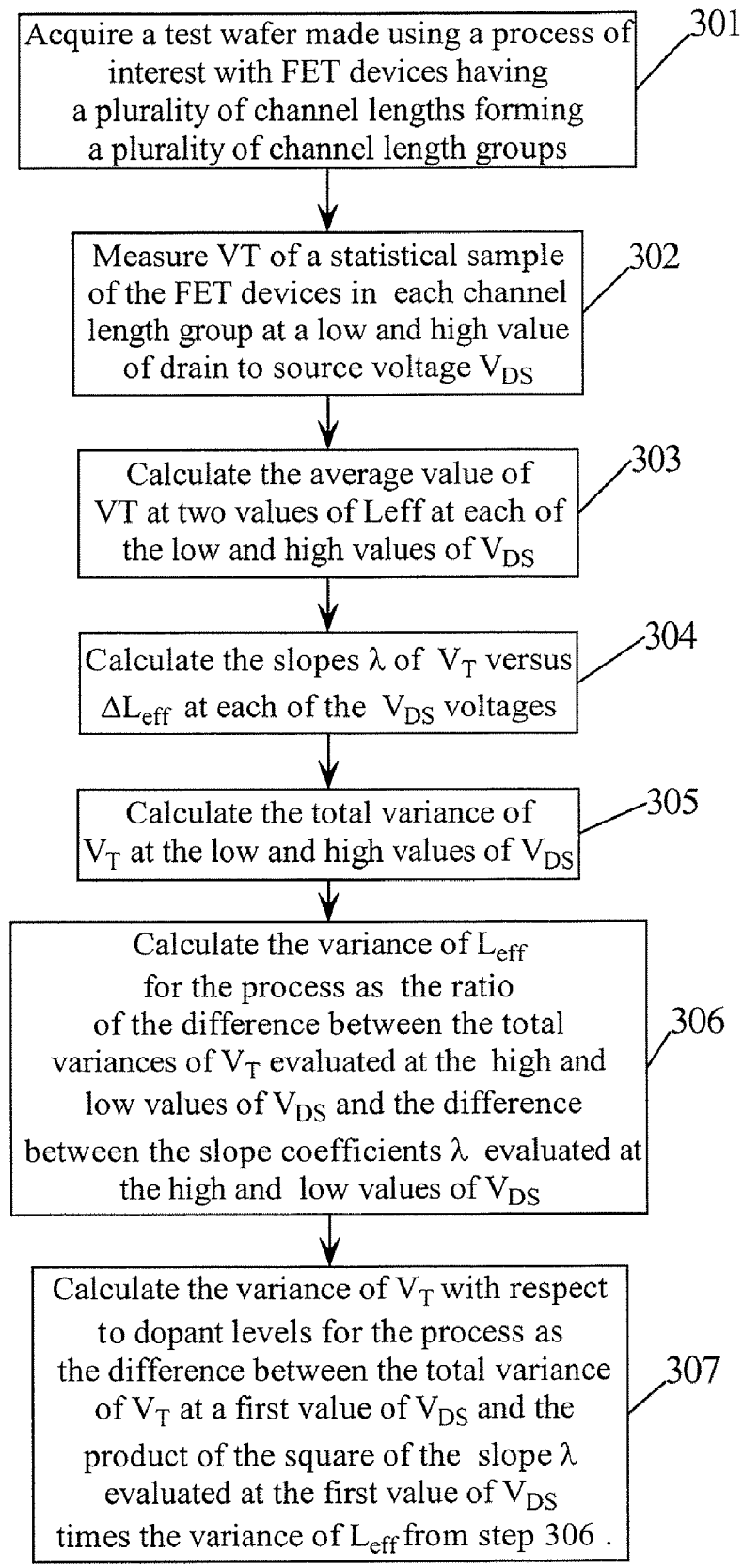
FIG. 3 is a flow diagram of methods steps used in embodiments of the present invention.

FIG. 3 is a flow charge of method steps used in embodiments of the present invention. In step 301, a test wafer is prepared on a process of interest with FET devices having a plurality of channel lengths forming a plurality of channel length groups. In step 302, VT of a statistical sample of the FET devices in each channel length group are measured using an a wafer tester at a low and high value of drain-to-source voltage VDS. In step 303, the average value of VT at two values of Leff at each of the low and high values of VDS are calculated using processor program steps. In step 304, the slopes $\lambda$ relating VT and $\Delta$Leff at each of the VDS voltages are calculated using processor program steps. In step 305, the total variances of VT at the low and high values of VDS are calculated using processor program steps. In step 306, the variance of Leff for the process is calculated using processor program steps as the ratio of the difference between the total variances of VT evaluated at the high and low values of VDS and the difference between the slopes $\lambda$ evaluated at the high and low values of VDS. In step 307, the variance of VT with respect to dopant levels for the process is calculated using processor program steps as the difference between the total variance of VT at one value of VDS and the product of the square of the slope $\lambda$ evaluated at the same one value of VDS times the variance of Leff from step 306.

Although the present invention and its advantages have been described in detail, it should be understood that various changes, substitutions and alterations can be made herein without departing from the spirit and scope of the invention as defined by the appended claims.

What is claimed is:

1. A method for separating integrated circuit (IC) variables comprising the steps of:
    testing an IC wafer fabricated with a particular process and having a plurality of channel length groups of field effect transistor (FET) devices wherein each group is fabricated to have a different effective channel length (Leff);
    measuring a threshold voltage (VT) of a statistically large number of the FET devices in each of the channel length groups at a first drain-to-source-voltage (VDS) and at a second VDS greater than the first VDS;
    calculating a mean value of VT for the FET devices corresponding to each of the plurality of channel length groups at the first and second VDS;
    calculating total variances of VT of the FET devices from the channel length groups measured at the first VDS and the second VDS;
    calculating a slope coefficient $\lambda$ relating VT to Leff as a ratio with a numerator equal to a difference in the means of VT of the FET devices from two channel length groups and a denominator equal to a difference in channel lengths of the two channel length groups;
    calculating, for the particular process, a variance of Leff as a ratio with a numerator equal to a difference between the square of coefficient $\lambda$ determined at the second VDS and the square of coefficient $\lambda$ determined at the first VDS and a denominator equal to a difference between the total variance of VT at the second VDS and the total variance of VT at the first VDS; and calculating, for the particular process, a variance of VT with respect to dopant levels as a difference between the total variance of VT calculated at the first VDS value and a product of the square of the slope coefficient λ determined at the first VDS value times the variance of Leff.

2. The method of claim 1, wherein the second value of VDS is as least ten times the value of the first VDS.

3. The method of claim 2, wherein the first value of VDS is approximately 0.050 volts.

4. The method of claim 1, wherein the FET devices in the channel length groups have channel lengths set to differ by at least 5 nanometers.

5. The method of claim 1, wherein the FET devices in one of the channel length groups has channel lengths set to 60 nanometers.

6. The method of claim 1, wherein the variance of VT with dopant levels and the variance of Leff are used to vary process parameters for making ICs using the particular process to minimize the variance of VT.

* * * * *